United States Patent [19]
Kaneko et al.

[11] Patent Number: 5,211,802
[45] Date of Patent: May 18, 1993

[54] METHOD FOR PRODUCING SILICON SINGLE CRYSTAL FROM POLYCRYSTALLINE ROD FORMED BY CONTINOUS CASTING

[75] Inventors: Kyojiro Kaneko; Hideyuki Mizumoto, both of Osaka; Teruoki Misawa, Hyogo, all of Japan

[73] Assignee: Osaka Titanium Co., Ltd., Hyogo, Japan

[21] Appl. No.: 678,192

[22] Filed: Apr. 1, 1991

[30] Foreign Application Priority Data

Mar. 30, 1990 [JP] Japan .................................. 2-85193

[51] Int. Cl.$^5$ ............................................. C30B 29/06
[52] U.S. Cl. .............................. 156/616.2; 156/620.7; 156/620.71; 156/620.73; 156/620.74; 156/DIG. 64; 423/DIG. 16
[58] Field of Search ............. 156/616.2, 620.7, 620.71, 156/620.73, 620.74, DIG. 64

[56] References Cited

U.S. PATENT DOCUMENTS

| | | | |
|---|---|---|---|
| 2,743,199 | 4/1956 | Hull et al. ........................ | 156/616.2 |
| 3,663,180 | 5/1972 | Brissot et al. ..................... | 156/620.7 |
| 4,325,777 | 4/1982 | Yarwood et al. ............... | 156/620.71 |
| 5,006,317 | 4/1991 | Sanjurjo ........................... | 156/620.4 |

*Primary Examiner*—Olik Chaudhuri
*Assistant Examiner*—Felisa Garrett
*Attorney, Agent, or Firm*—Oblon, Spivak, McClelland, Maier & Neustadt

[57] ABSTRACT

A method of producing single-crystal silicon is disclosed. Polycrystalline silicon rod is formed from polycrystalline silicon granules, lumps or a mixture thereof by continuous casting through electromagnetic induction. Then, silicon single cyrstal is grown from the polycrystalline silicon rod by the FZ method.

6 Claims, 2 Drawing Sheets

METHOD FOR PRODUCING SILICON SINGLE CRYSTAL FROM POLYCRYSTALLINE ROD FORMED BY CONTINOUS CASTING

BACKGROUND OF THE INVENTION

1. Field of the Invention

The present invention relates to a method for producing silicon single crystal, which can be used as a material for semiconductor devices, solar cells and the like.

2. Background of the Invention

Single-crystal material, in particular single-crystal silicon in large volume, is an essential material for the development of highly effective solar batteries (solar cells). There are primarily two processes for forming single-crystal silicon. A single-crystal silicon rod obtained by the Float Zone (FZ) method, is recognized to have the highest quality among current methods. The Czochralski (CZ) method, an alternative to the FZ method for providing single-crystal silicon, cannot eliminate the defects caused by dissolved oxygen due to the use of a silica (quartz) crucible. FIG. 2 shows a manufacturing method for a single-crystal silicon rod according to the FZ method.

The conventional manufacturing method for a single-crystal silicon rod in accordance with the FZ method uses as a starting material, a polycrystalline silicon rod manufactured by the Siemens process. The Siemens process is described in Ger. Offen 1,102,117. A polycrystalline silicon rod (50) is partially melted by inserting the material into an induction coil (40a) to form a single-crystal silicon rod (51) which is further inserted into a second induction coil (40b) to provide the product of a single-crystal silicon rod (52). Two FZ melting steps are required to fully exhaust gas contained in the material (50) as instructed in manufacturing manuals published by the developers of the FZ method.

The conventional method provides a single-crystal silicon rod of a long lifetime, high specific resistance and the like, each essential for the solar cells, but at a high cost and price. The economics of production by the conventional method hinders provision of single-crystal silicon in a large volume for solar cells.

The reasons for the high cost to produce the single-crystal silicon by the FZ method are mainly as follows:

(1) There is a high cost to produce the starting material polycrystalline silicon rod by the Siemens process.

(2) There is high loss of the polycrystalline silicon rod manufactured by the Siemens process in preparing the rod for FZ melting. Due to irregularities in the outer diameter of the rod manufactured by the Siemens process, the outer surface of the rod must be shaped in order to fit between the induction coils for FZ melting. This introduces waste of polycrystalline silicon.

(3) Two FZ melting process steps must be performed to obtain high quality single-crystal silicon rods. A single FZ melting is insufficient to obtain high quality single-crystal silicon.

The reasons for the high cost associated with producing polycrystalline silicon by the Siemens process is as follows. This process is conducted basically in batch production and is thereby low in production efficiency. The Siemens process has the additional drawback in that the surface area for deposition of silicon is smaller with respect to the furnace capacity. Further, the furnace surface dissipates heat rapidly, thereby leading to a high cost of production.

In recent years, the fluidized-bed granulation process, as an alternative to the Siemens process has been given attention as a manufacturing method for polycrystalline silicon. The applicant has developed this process (Japanese Patent Applications Nos. 324010/1988, 100929/1989, 100930/1990).

The fluidized-bed granulation process continuously grows polycrystalline silicon granules in a fluidized-bed reactor (FBR) and extracts them therefrom, so that the process is substantially high in production efficiency in comparison with the Siemens process of batch production. Further, the ratio of the surface area for deposition of silicon with respect to the capacity of a FBR is especially larger, thereby providing definite advantages in productivity, efficiency of power consumption and the like, and a notably lower cost to produce polycrystalline silicon in comparison with the Siemens process. While fluidized-bed granulation efficiently produces polycrystalline silicon granules, the granules are inappropriate for direct crystallization by the FZ method due to low quality as well as small size.

Despite the existing methods, no one has provided an economical process for producing polycrystalline silicon rods of high quality from the cheap granules.

SUMMARY OF THE INVENTION

Accordingly, an object of the present invention is to provide a manufacturing method for single-crystal silicon which provides single-crystal silicon of a quality equivalent to that obtained by the conventional FZ method at a largely lower cost.

Another object of this invention is to provide a method for producing polycrystalline silicon rod which provides polycrystalline silicon rod of much higher quality than that obtained by the conventional Siemens process at an equivalent cost.

The objects of the present invention are achieved by a manufacturing method comprising:

i) forming a polycrystalline silicon rod from polycrystalline silicon granules by continuous casting through electromagnetic induction; and ii) growing silicon single crystal using said polycrystalline silicon rod by the Float-Zone method.

The present process provides high quality single-crystal silicon after a single FZ melting while two FZ meltings are required by the conventional FZ method.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
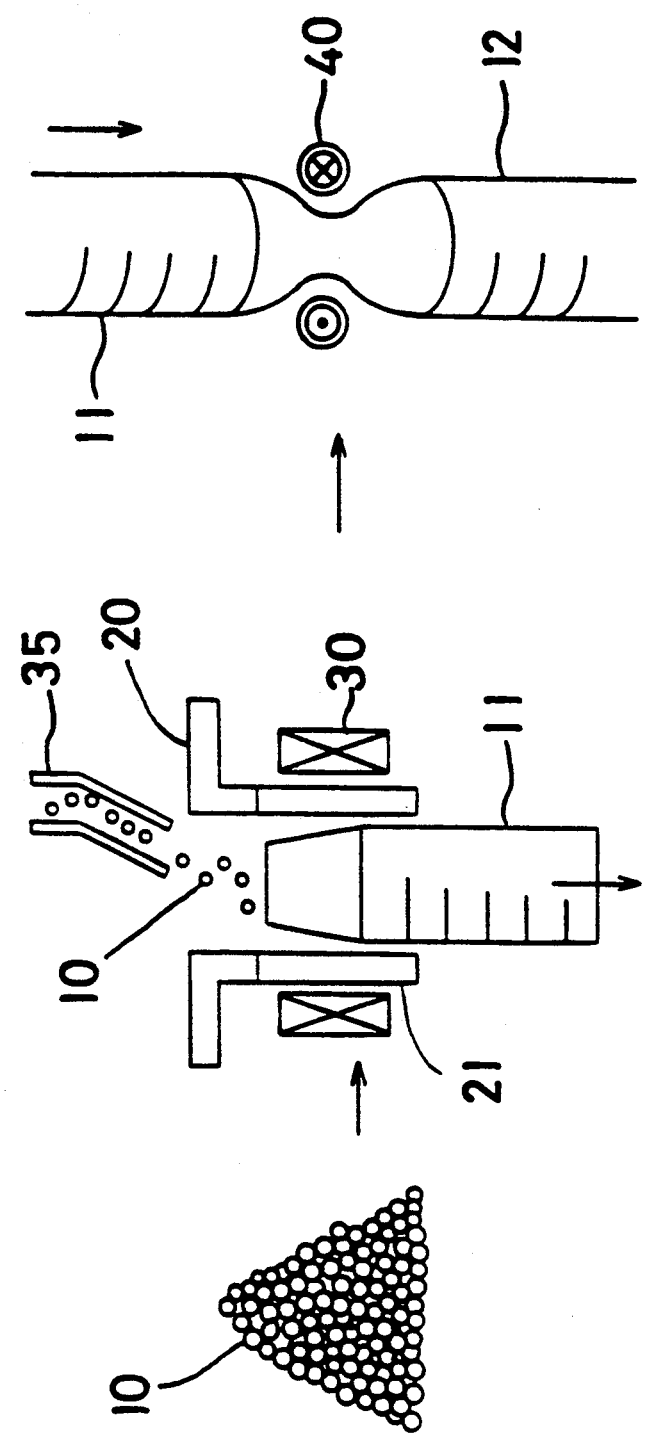
FIG. 1 is a schematic diagram showing the steps of practical use of the present invention.
Figure 2:
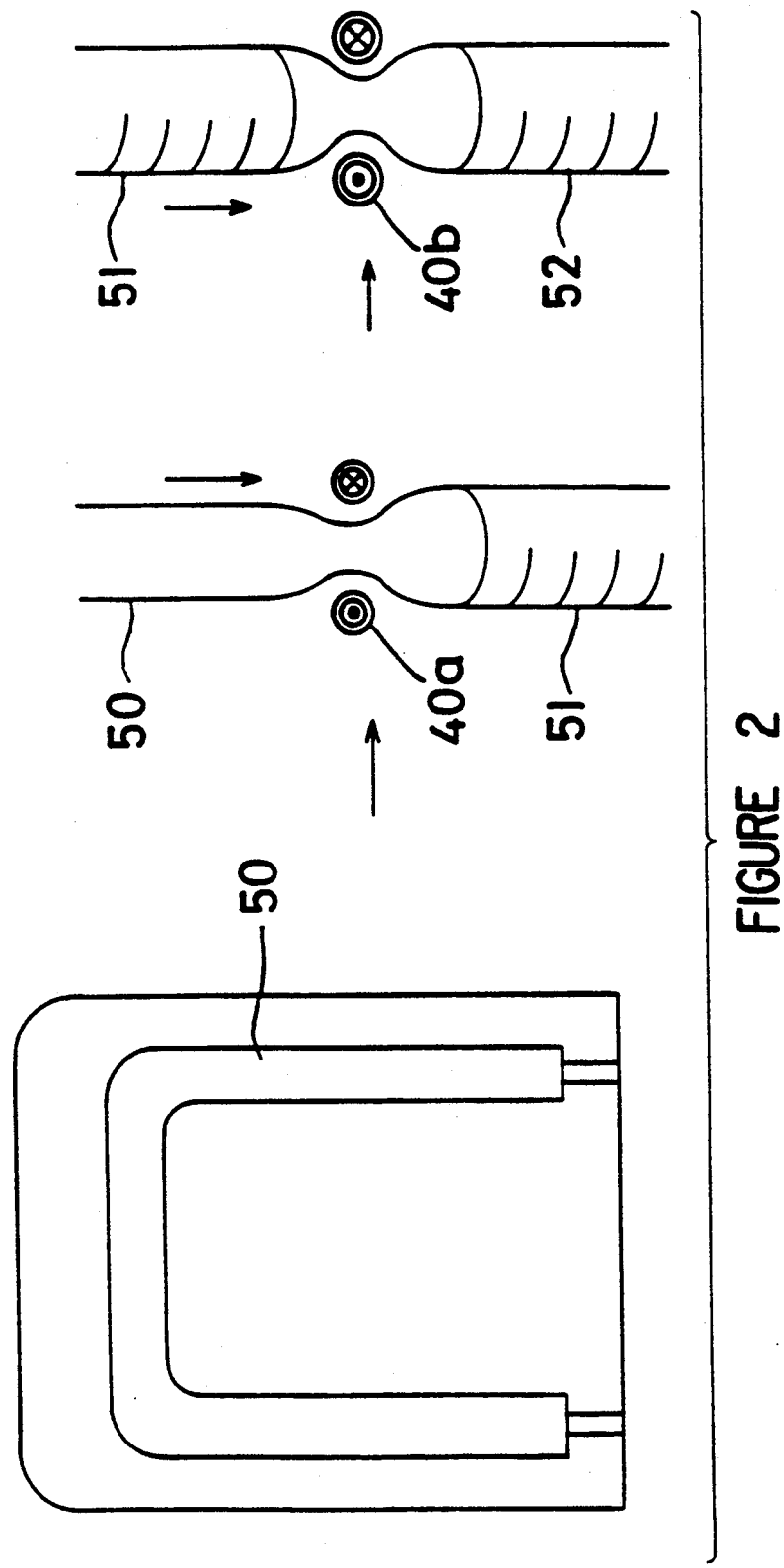
FIG. 2 is a schematic diagram showing the conventional FZ method.

In addition to the aforesaid manufacturing method of polycrystalline silicon by the fluidized-bed granulation process, the applicant has also studied a manufacturing method for polycrystalline silicon by a continuous casting through electromagnetic induction, and found that a combination of the fluidized-bed granulation process, the continuous casting through electromagnetic induction and the FZ method provides a quite reasonable and economical manufacturing method for single-crystal silicon of high quality.

A cheap silicon material for solar cells (solar-grade silicon) manufactured by carbon reduction process has been studied in recent years In this method, silica sand is reduced by coke at a high temperature. When the method is put into practical use, crushed product (lump) of the silicon material can be also usable solely or mixed with granules The manufacturing method for single-crystal silicon of the present invention is characterized in that i) a polycrystalline silicon rod is manufactured by continuous casting through electromagnetic induction of polycrystalline silicon granules, lumps or the mixture, ii) silicon single crystal is grown by the FZ method using the polycrystalline silicon granules or lumps.

The continuous casting method through electromagnetic induction disposes in an induction coil bottomless conductive crucible circumferentially divided at at least a part in the axial direction thereof to melt raw material in the bottomless crucible and pulls down therefrom the melted raw material being solidified to form an elongated rod. In this method, raw material in the bottomless crucible does not contact with a inner surface of the crucible, so that the method when used for manufacturing a polycrystalline silicon rod exhibits an advantage to fully prevent contamination of the silicon rod by the bottomless crucible.

The United States Department of Energy has filed a patent application in Japan for a manufacturing method for polycrystalline silicon by using the continuous casting through electromagnetic induction on the basis of the above concept (Japanese Unexamined Patent Application No. 52962/1986, corresponds to U.S. Pat. No. 4,572,812) and the applicant of the present application has continuously studied this method for industrialization (Japanese Unexamined Patent Applications Nos. 264920/1989 and 30698/1990). The entire disclosure of U.S. Pat. No. 4,572,812 is incorporated herein by reference.

The combination of granular silicon material with the continuous casting method through electromagnetic induction manufactures at a low cost a polycrystalline silicon rod for the FZ method with high quality. This method also provides through a single FZ melting of a polycrystalline silicon rod, a single-crystal silicon rod of very high quality, equivalent to that obtained by two FZ melting steps of a polycrystalline silicon rod manufactured by the conventional Siemens process. Therefore the present process offers a tremendous economic advantage in providing single-crystal silicon by a single FZ melting of equivalent quality to single-crystal silicon obtained by two FZ meltings.

In addition, due to the more uniform outer-diameter, the polycrystalline silicon rod, is not required to be largely cut at its outer surface as required for polycrystalline silicon rods manufactured by the Siemens process in preparing for the FZ method. This offers another economic advantage in reducing waste. Hence, a single-crystal silicon rod of very high quality can be manufactured at a notably low cost by the present process.

Next, explanation will be given on an embodiment of the present invention. The manufacturing method for single-crystal silicon of the present invention uses as raw material polycrystalline silicon granules upon conducting the continuous casting through electromagnetic induction as shown in FIG. 1.

Referring now to the drawings, wherein like reference numerals designate identical or corresponding parts throughout FIG. 1. The method of continuous casting through electromagnetic induction is disclosed as follows. In brief, a cylindrical bottomless crucible (20) and induction coils (30) are disposed in a vacuum chamber (not shown). The bottomless crucible (20) may use, for example, a water-cooled copper crucible circumferentially divided at the body except the upper end portion. The induction coils (30) are fit onto the outer periphery of the bottomless crucible at the divided parts (21) in a manner of being coaxially spaced from each other. Polycrystalline silicon granules (10) are fed into the bottomless crucible (20) through a hopper (35) and are melted in the state of no contact with the inner surface of the crucible (20). Feeding of raw material into the bottomless crucible (20) and pulling down of melted raw material which being solidified from the crucible are used to continuously manufacture a polycrystalline silicon rod (11) (unidirectionally solidified cast block of silicon).

The outer diameter of the polycrystalline silicon rod (11) manufactured is decided by the inner diameter of the bottomless crucible (20), so that the polycrystalline silicon rod has a uniform outer diameter over the total length. Hence, the outer surface of the rod is only cut slightly to allow the rod to have the required outer diameter for FZ melting. In the FZ melting, the polycrystalline silicon rod (11) with a finished outer surface is fit through an induction coil (40) to form a single-crystal silicon rod (12).

The polycrystalline silicon granules manufactured by the fluidized-bed granulation process are almost half the price at present in comparison with a polycrystalline silicon rod manufactured by the Siemens process and the price is expected to be further lowered following realization of practical use of silicon for solar-grade silicon manufactured by carbon reduction process. The cost to produce a polycrystalline silicon rod including the cost for the continuous casting through electromagnetic induction may be controlled at a fraction of the cost to produce by the Siemens process.

In addition, the polycrystalline silicon rod manufactured by the continuous casting through electromagnetic induction method and by using as raw material polycrystalline silicon granules is of higher quality than a polycrystalline silicon rod manufactured by the Siemens process, and a single-crystal silicon rod of quality equivalent to that obtained by two FZ melting steps of a polycrystalline rod produced by the Siemens process can be obtained with a single FZ melting.

Furthermore, the polycrystalline silicon rod-produced by continuous casting through electromagnetic induction is higher in accuracy of outer diameter in comparison with a Siemens' rod. Since the polycrystalline silicon rod produced by continuous casting is of more uniform outer diameter, there is less waste in shaping the polycrystalline rod to prepare for FZ melting. Since a single FZ melting is enough to obtain a single-crystal silicon rod of high quality, the price of the single-crystal silicon rod (12) can be notably reduced.

Table 1 shows a comparison between the present invention and the conventional method with respect to a cost and quality of a single-crystal silicon rod of 5 ins. in outer diameter manufactured by the two methods.

Conditions for manufacturing by the present invention are shown in Table 2.

Hence, a polycrystalline silicon rod by electromagnetic casting when subjected to a single FZ melting step can

TABLE 1

| | Polycrystalline silicon rod | | | Single crystal silicon rod | | | |
|---|---|---|---|---|---|---|---|
| | Manufacturing methods | Relative Price | Quality | Means for single-crystallization | Loss by cutting | Relative Price | Quality |
| The present invention | Fluidized-bed granulation + Continuous casting with electromagnetic induction | 100 | (1) Specific resistance<br>(2) Rod shape<br>(3) Gas content<br>(1) 1000 Ωcm or more<br>(2) Uniform rod diameter No bending<br>(3) None | Once by FZ melting | 15% | 44 | (1) Lifetime<br>(2) Dispersion of Specific resistance<br>(1) 2500-3000 μsec ($\rho$ = 1000 Ωcm or more)<br>(2) Uniform wafer surface |
| Conventional method | Siemens process | 100 | (1) 1000 Ωcms or more<br>(2) Ununiform rod diameter, bent<br>(3) chlorine 5-20 ppm, hydrogen little | Twice by FZ melting | 34% | 100 | (1) 2500-3000 μsec ($\rho$ = 1000 Ωcm or more)<br>(2) Uniform wafer surface |

TABLE 2

| | | |
|---|---|---|
| Conditions of electromagnetic casting | Particles diameter of granules material | 1 to 3 mm |
| | Diameter of ingot | 5 ins. |
| | Length of ingot | 200 cm |
| | Pull velocity | 3.0 mm/min |
| | Power dissolution output | 85 kw |
| | Ar pressure | 1.05 atmosphere |
| Conditions of FZ melting | Diameter of ingot | 5 ins. |
| | Length of ingot | 100 cm |
| | Pull velcosity | 2.0 mm/min |
| | The number of rotation | 6 Rpm |
| | Power frequency | 2 MHz |
| | Ar pressure | 1.05 atmosphere |

As seen in Table 1, the polycrystalline silicon rod manufactured by the present invention has high quality achieved by a single FZ melting and equivalent to that obtained by the conventional double FZ melting, so that the present process is apparently economical in comparison with the conventional method. The reasons that the polycrystalline silicon rod of the present invention has high quality are appreciated as follows.

The Siemens process conducts deposition of silicon through a gas phase reaction, so that reaction products such as chlorine and hydrogen may be entrained into the silicon rod in trace quantity. The trapped gas volatilizes during the first FZ melting of the silicon rod to agitate the stable condition of the silicon melt melted in the zone and disturbing the growth of single-crystal silicon of high quality. Therefore a second FZ melting is necessary to complete single-crystal formation. Thus a Siemens produced polycrystalline rod needs to be processed a second time to obtain a high quality single-crystal.

A polycrystalline silicon rod produced by electromagnetic casting previously dissipates all gas content, so the disruption of crystal growth in the melting step is minimized. Therefore there are no factors to disturb the stable holding of the silicon melt upon FZ melting.

grow single-crystal silicon of high quality.

As seen from the above, the manufacturing method for single-crystal silicon of the present invention provides such advantages that it is notably economical and ensures enough quality of the single-crystal silicon for an element for highly effective solar cells and the like, thereby largely contributing to the development of highly effective solar cells and the like.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A manufacturing method for single-crystal silicon, comprising:
   i) forming a polycrystalline silicon rod from polycrystalline silicone granules, lumps or a mixture thereof by continuous casting through electromagnetic induction; and
   ii) growing silicon single crystal from said polycrystalline silicon rod by the float-zone method.

2. A method for producing silicon single crystal according to claim 1, wherein said silicon granules are produced by fluidizded-bed granulation process.

3. A method for producing silicon single crystal according to claim 1, wherein said silicon lumps are produced by carbon reduction process.

4. A method for producing polycrystalline silicon rod from polycrystalline silicon granules, lumps or mixture thereof by continuous casting through electromagnetic induction.

5. A method for producing polycrystalline silicon rod according to claim 4, wherein said silicon granules are produced by fluidized-bed granulation process.

6. A method for producing polycrystalline silicon rod according to claim 4, wherein said silicon lumps are produced by carbon reduction process.

* * * * *